United States Patent [19]
Nagaura et al.

[11] Patent Number: 6,049,139
[45] Date of Patent: Apr. 11, 2000

[54] METHOD AND APPARATUS FOR DETECTING ABNORMALITY OF CABLE HAVING ELECTRICAL CONDUCTION LINE SURROUNDING POWER SUPPLY LINE USED IN CAR

[75] Inventors: Wataru Nagaura, Hitachi; Tatsuya Yoshida, Urizura-machi; Hiroyuki Saito, Hitachinaka; Shinichi Sakamoto, Mito; Mitsuru Koni, Hitachinaka, all of Japan

[73] Assignees: Hitachi, Ltd.; Hitachi Car Engineering Co., Ltd.

[21] Appl. No.: 09/093,887

[22] Filed: Jun. 9, 1998

[30] Foreign Application Priority Data

Jun. 10, 1997 [JP] Japan .................................. 9-151885

[51] Int. Cl.<sup>7</sup> ...................................................... H04Q 9/00
[52] U.S. Cl. ........................ 307/10.1; 307/125; 324/503; 340/650
[58] Field of Search ..................... 307/10.1, 125, 307/130, 131; 361/93, 91, 88; 340/825.07, 540, 650; 324/503, 500; 388/909

[56] References Cited

U.S. PATENT DOCUMENTS

| | | | |
|---|---|---|---|
| 3,952,286 | 4/1976 | Wakamatsu et al. | 340/825.07 |
| 4,177,420 | 12/1979 | Tripp | 324/503 |
| 5,343,350 | 8/1994 | Pohl et al. | 361/93 |
| 5,559,661 | 9/1996 | Meinders | 361/93 |
| 5,723,958 | 3/1998 | Boll et al. | 318/909 |

FOREIGN PATENT DOCUMENTS

| | | |
|---|---|---|
| 58-103704 | 6/1983 | Japan . |
| 58-218709 | 12/1983 | Japan . |
| 1-102777 | 7/1989 | Japan . |
| WO 96/26570 | 8/1996 | WIPO . |

*Primary Examiner*—Albert W. Paladini
*Attorney, Agent, or Firm*—Evenson, McKeown, Edwards & Lenahan, PLLC

[57] ABSTRACT

In order to detect abnormality of a cable, the cable has an electrical conduction line surrounding a power supply line, an electric potential of the electrical conduction line is controlled by a controller, and the abnormality of the cable is judged by detecting the inability of the controller not to control the electric potential of the electrical conduction line in case of contact by the electrical conduction line with the ground or the power supply line. Damage to the power supply line from the accident is prevented by previously detecting the accident of the cable, thereby, the reliability of the cable is highly improved.

6 Claims, 12 Drawing Sheets

FIG.2
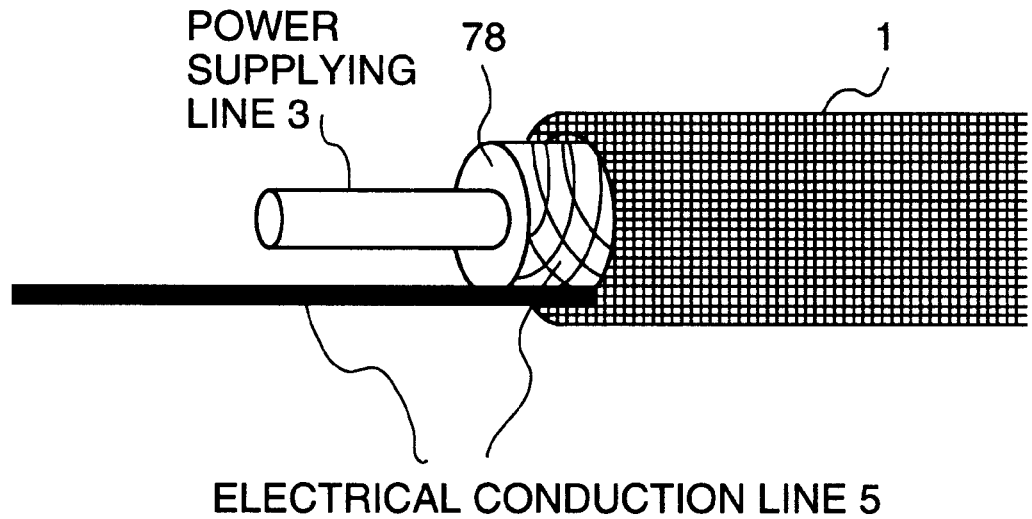
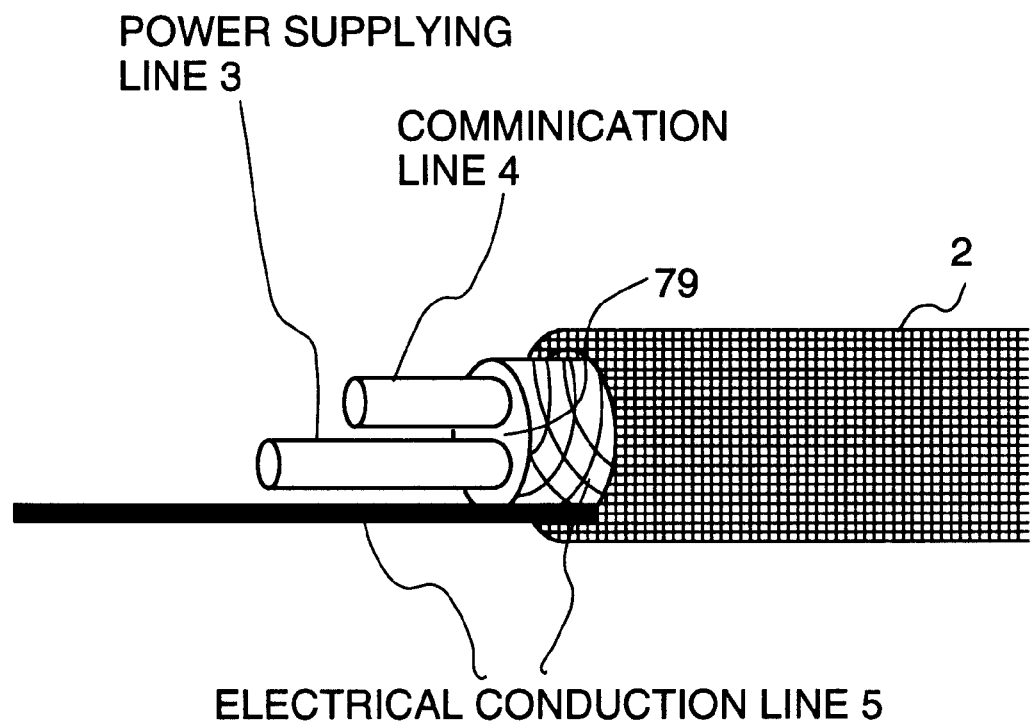

| SHORT CIRCUIT SENSOR LINE POTENTIAL CONTROL SIGNAL 31 / SHORT CIRCUIT SENSOR LINE POTENTIAL SIGNAL 32 | L | H |
|---|---|---|
| L | GROUND FAULT | NORMAL |
| H | NORMAL | SHORT-CIRCUIT TO POWER SOURCE |

| ACCIDENT DETECTION TERMINAL 78 | CABLE CONDITION |
|---|---|
| Vcc | SHORT CIRCUIT TO POWER SOURCE |
| $\frac{R1}{R1 + R2} Vcc$ | NORMAL |
| Vcc | DISCONNECTION |
| 0 | GROUND FAULT | ced
METHOD AND APPARATUS FOR DETECTING ABNORMALITY OF CABLE HAVING ELECTRICAL CONDUCTION LINE SURROUNDING POWER SUPPLY LINE USED IN CAR

BACKGROUND OF THE INVENTION

Present invention relates to an abnormal detection apparatus for a cable including a power supply line used in a car.

An electrical fuse is used for overcurrent protection in the event of a short circuit to ground in a power supply line used in a motor vehicle, such as a car. The power supply line is generally provided so as to form a star type architecture around a battery, and the electrical fuse is located at the nearest location to the battery.

When a ground short circuit occurs in a power supply line, that portion of the power supply line connected downstream of the electric fuse is interrupted, and it thus becomes impossible to supply electric power over the power supply line. Thus, one part of the necessary function of the power supply line stops. Such ground short circuits are shown in Japanese Patent Laid-open Nos. 58-103704 (1983) and 58218709 (1983), and Japanese Utility-model Laid-open No. 1-102777 (1989).

A loop formation type power supply line is one of the power supply lines which do not lose a needed function even if the ground short circuit occurs.

The loop formation type power supply line supplies the power in two directions, the needed function is not lost for the power supply line interception in the ground short circuit.

As the power source is supplied in two directions in a power supplying line of loop type formation, the place where the ground short circuit occurs should be detected, and only the place should be intercepted. However, it is difficult to detect the ground short circuit of the power supply line in the function. Therefore, if the abnormality of the power supply line may be detected previously, any suitable countermeasures are taken before the abnormality occurs in the power supply line, thereby reliability is improved and a needed function may be kept.

SUMMARY OF THE INVENTION

Object of the present invention is in providing a means to detect abnormality of a cable, including a power supply line, by detecting a previous sign of an abnormality occurring in a power supply line, as an abnormality of said cable including said power supply line. In order to attain the above stated object, an abnormal detection apparatus for a cable including a power supply line used in the car in the present invention comprises an electrical conduction line surrounding the power supply line for detecting abnormality of the cable (hereinafter called an electrical conduction line for short circuit sensor), a control part for controlling a function to form a control signal to control an electric potential of the electrical conduction line for the short circuit sensor, and a function to take in the electric potential of the electrical conduction line for the short circuit sensor as a potential signal, and a function to judge an accident of the cable by comparing the control signal and the potential signal, and a drive department having a function to control the electric potential of the electrical conduction line for the short circuit sensor from a signal generated from the control part, and a function to output the electric potential of the electrical conduction line for the short circuit sensor as a signal to the control part.

BRIEF DESCRIPTION OF THE DRAWINGS

FIGS. 2a and 2b show block-diagrams of the cable.

PREFERRED EMBODIMENTS OF THE PRESENT INVENTION

Figure 1:
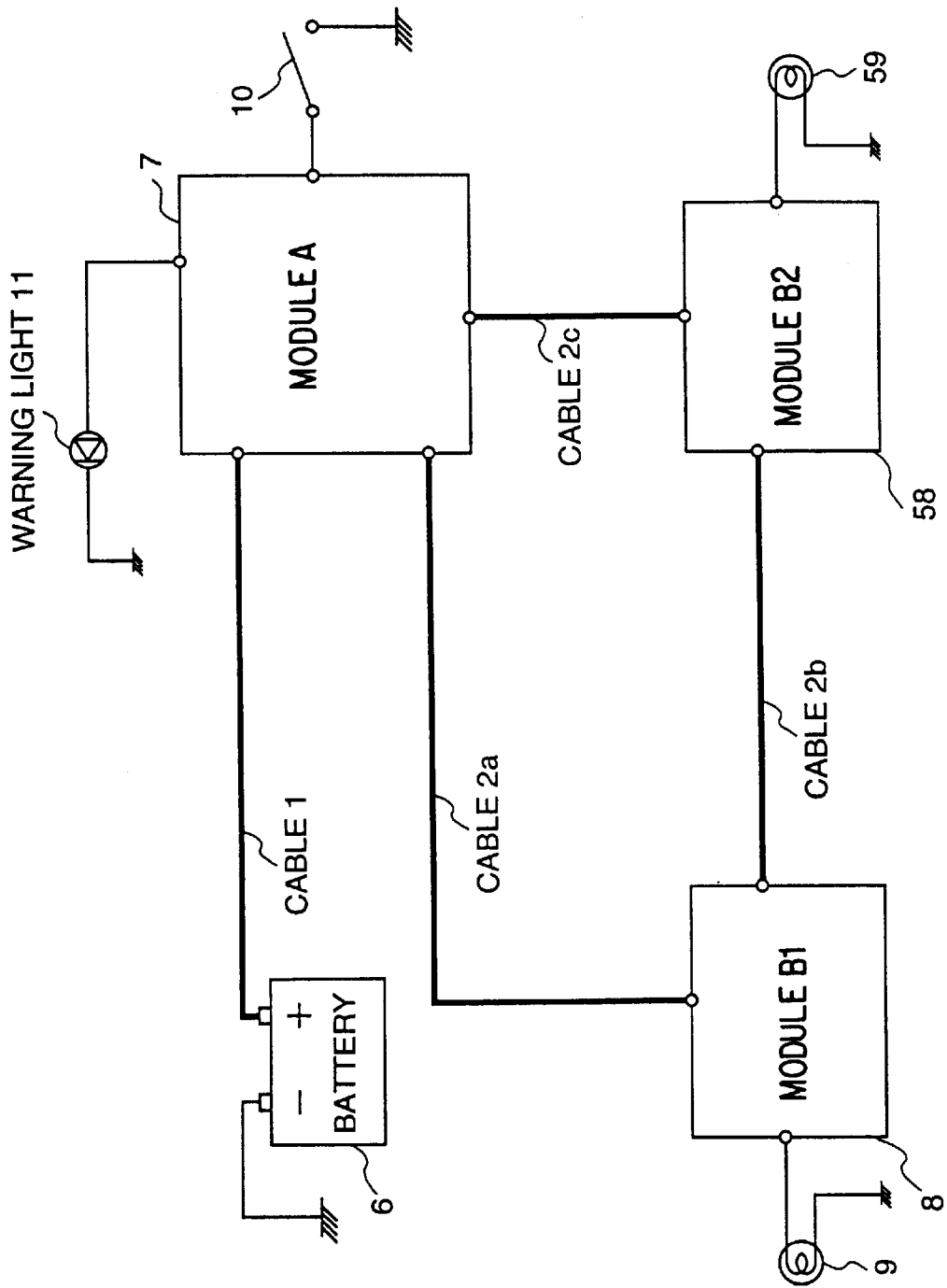
FIG. 1 is a block diagram showing a remote control vehicle light operation system having a cable accident detection apparatus.

FIG. 1 shows an example of a remote control system of a light having an accident detection apparatus of a cable. This system relates to an ON/OFF control system for controlling two lights 9,59 that are respectively disposed at remote positions by using a light switch 10 provided in a remote place. The two lights 9,59 have their ON/OFF operation controlled by changing the condition of light switch 10 into a signal which is to be communicated.

This system is constructed with a module A, which is connected to a light switch 10 and a warning light 11,, modules B1, B2, which are respectively connected to the two lights, cables 1, 2a, 2b, 2c which interconnect the modules and a battery 6 functioning as a power source. The warning light is illuminated when a fault on one of the cables is detected.

The module A functions to (1) change the condition of the light switch 10 into a signal and to transmit the signal to the modules B1, B2; (2) detect the accident in the cables 1, 2a, 2b, 2c; (3) receive a message of a signal to inform the operator of an accident in the cables 2b, 2c from the modules B1, B2; and (4) operate the warning light 11 to inform the operator of the presence of the accident in all cables.

The modules B1,B2 function to receive a signal representing the condition of the light switch 10 from the module A; to drive the lights 9, 59; to detect an accident in the cables 1b, 1c; and to transmit a signal representing the presence of an accident in the cables 1b, 1c.

The circuitry of module B1 monitors the cable 2b for accidents (faults) and the circuitry of module B2 monitors the cable 2c. There are two types of cables—the cable 1 to connect the module A to the battery 6, and the cables 2a, 2b, 2c to connect between the modules A, B1, B2. The modules are connected so as to form a loop state connection.

FIGS. 2a and 2b show the construction of the cables. The cable 1 is constructed with a power supply line 3 and an electrical conduction line 5 for a short circuit sensor surrounding the power supply line 3 through an electric insulator 78.

The cable 2 is constructed with a power supply line 3, a communication line 4 and an electrical conduction line 5 for a short circuit sensor surrounding the power supply line 3 through an electric insulator 79.

In the present invention, reference to a "cable accident" refers to, for example, a disconnection of the cable connector or a severance of the cable, a short-circuit between the electrical conduction line 5 of the short circuit sensor and the power supply line 3, the communication line 4 or ground due to damage to the cable, and disconnection of the electrical conduction line 5 of the short circuit sensor.

In addition to the above, herein after, the connector falling off of the cable and the disconnection of the electrical conduction line 5 for the short circuit sensor will simply be called a disconnection.

Figure 3:
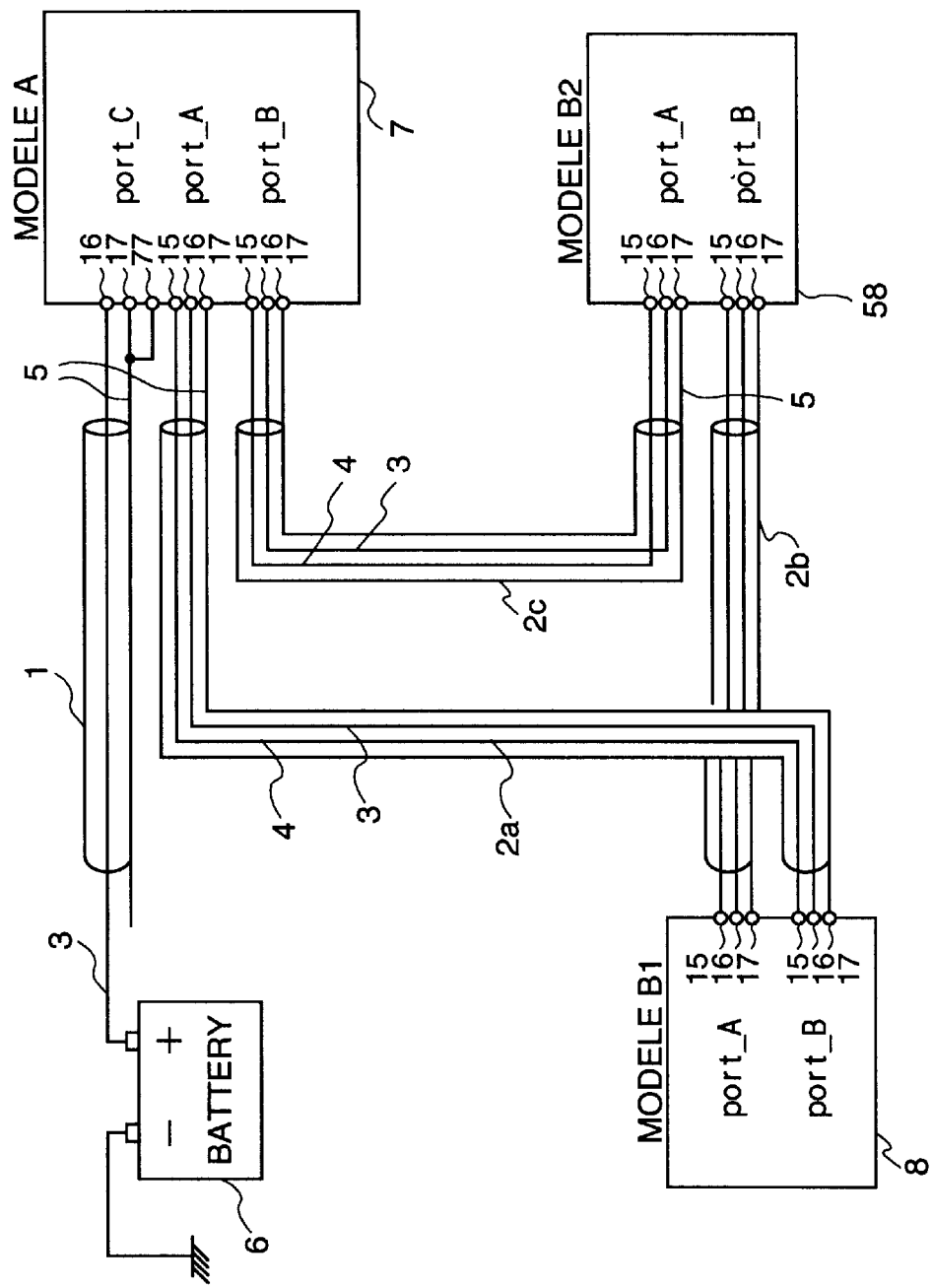
FIG. 3 shows a connection diagram between modules and between the modules and a battery.

FIG. 3 shows the connection between the modules of this system and the battery 6. The module A and battery 6 are connected via the cable 1 and the modules are connected with the cables 2a, 2b, 2c. The modules are connected so as to form a loop.

The module A has three kinds of cable connection ports, and they are respectively labelled port__A, port__B, port__C. The module B has two kinds of cable connection ports, and they are respectively labelled port__A, port__B. The port__A, the port__B, and the port__C respectively have three terminals, too. The port__A, or the port__B respectively have three terminals for a power supply line terminal 16, a communication line terminal 15, and an electrical conduction line terminal 17 for the short circuit sensor. The port__C has three terminals for a power supply line terminal 16, and an electrical conduction line terminal 17, 77 for the short circuit sensor. Only the module A has the port__C. The battery 6 is connected to the port__C of the module A with the cable 1. The battery is connected with cable 1 by connecting the power supply line 3 to a plus (or positive) terminal of the battery and by making the electrical conduction line 5 for the short circuit sensor a disconnection terminal. The cables 2a, 2b, 2c respectively connect between the port__A and the port__B of the respective modules, and form a loop.

Figure 4:
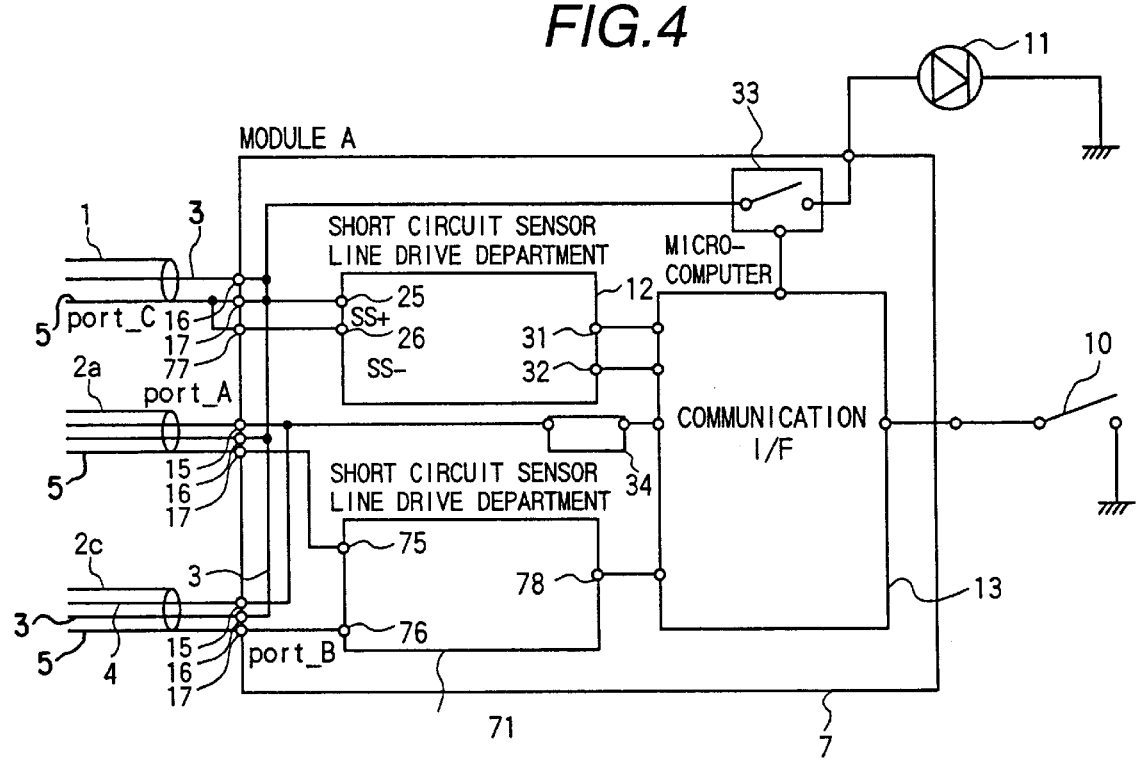
FIG. 4 shows a block-diagram of a module A.

FIG. 4 shows a construction of the module A. The module A is constructed with a microcomputer 13, two electrical conduction line electric potential drive departments for the short circuit sensors 12, 71 (herein after called short circuit sensor line drive department), a warning light drive switch 33, and a communication driver 34. The microcomputer 13 has functions to transmit a condition of the light switch 10 to the module B by changing the condition into a signal; to receive the signal to inform the operator of the presence of the cable accident from the module B; to judge the presence of an accident in the cable 1 and the cable 2a; to control the warning light drive switch 33; and to control the electric potential of the electrical conduction line 5 for the short circuit sensor.

The short circuit sensor line drive department 12 functions to control the electric potential of the electrical conduction line 5 for the short circuit sensor based on the control signal transmitted from the microcomputer 13; and to output the electric potential of the electrical conduction line 5 for the short circuit sensor into the microcomputer 13.

With a signal from terminal 32 of short circuit sensor line drive department 12, the microcomputer is capable of detecting a short-contact of the cable 1 to the plus terminal of the battery or the ground. The short circuit sensor line drive department 71 functions to change the electric potential of the electrical conduction line 5 for the short circuit sensor according to a short-circuit between the electrical conduction line 5 and the plus terminal of the battery or ground, or the disconnection or normal state of the electrical conduction line 5, and to output the electric potential of the electrical conduction line 5 for the short circuit sensor into the microcomputer 13.

The microcomputer is capable of detecting a short-circuit between the electrical conduction line 5 and the plus terminal of the battery or the ground, via a signal from a terminal 78 of the short circuit sensor line drive department 71. The microcomputer warning light drive switch 33 functions to switch the warning light 11 ON/OFF by a control signal generated from the microcomputer 13. The communication driver 34 functions to drive the communication line 4 based on the communication data output from the microcomputer 13, and to output a signal from the communication line 4 into the microcomputer 13. The electric power terminals 16 of the port__A, the port__B and the port__C as the connecting point with the cables, are connected, and the electric power from the battery is supplied to the module A and the modules B1, B2.

The terminals 15 for the communication lines 4 of the port__and the port__B are connected and are connected with the communication driver 34. The short circuit sensor terminals 17 and 77 of the port__C are connected with a ss+ terminal 25 and a ss− terminal 26 of the short circuit sensor line drive department 12. The short circuit sensor terminals 17 of the port__A and the port B are respectively connected with the terminal 75, 76 of the short circuit sensor drive part 71. A construction and an operation of the short circuit sensor line drive departments 12 and 71 will be explained in detail below.

Figure 5:
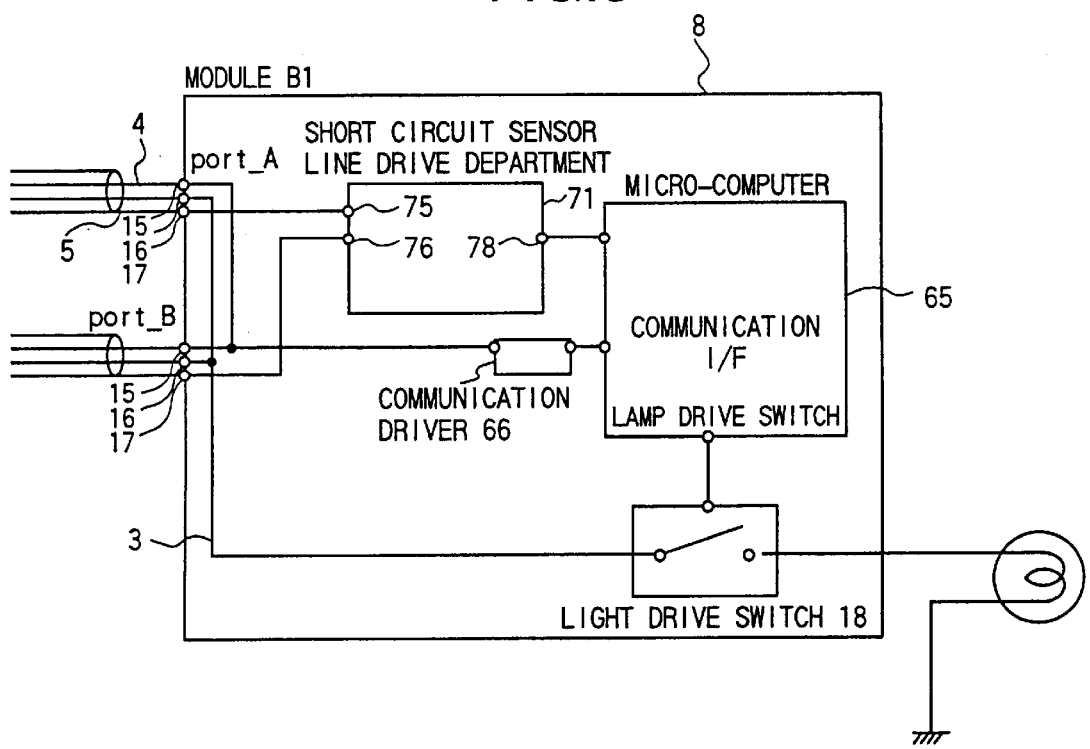
FIG. 5 shows a block-diagram of a module B.

FIG. 5 shows a construction of the modules B1, B2. The construction of the module B1 will be explained and the module B2 has a construction same as that of module B1. The module B1 is constructed with a microcomputer 65, the short circuit sensor line drive department 71, the light drive switch 18, and a communication driver 66.

The microcomputer 65 functions to judge the presence of the cable accident; to change the presence of the cable accident into a signal and to transmit it into the module A; to control the light drive switch 18; and to monitor the electric potential of the electrical conduction line 5 for the short circuit sensor.

The short circuit sensor line drive department 71 functions to control the electric potential of the electrical conduction line 5 for the short circuit sensor, and to output the electric potential of the electrical conduction line 5 for the short circuit sensor to the microcomputer 65. The light drive switch 18 functions to operate the ON/OFF condition of the light 9 via a control signal from the microcomputer 65. The communication driver 66 functions to drive the communication line 4 based on communication data output from the microcomputer 65, and to output signals from the communication line 4 into the microcomputer 65. The electric power terminals 16 of the port_A and the port_B which are connecting points with the cable are connected. The communication terminals 15 of the port_A and the port B are connected, and are connected with the communication driver 66. The short circuit sensor terminals 17 of the port_A and the port_B are respectively connected to the terminal 75 and the terminal 76 of the short circuit sensor line drive department 71.

Figures 6, 7:
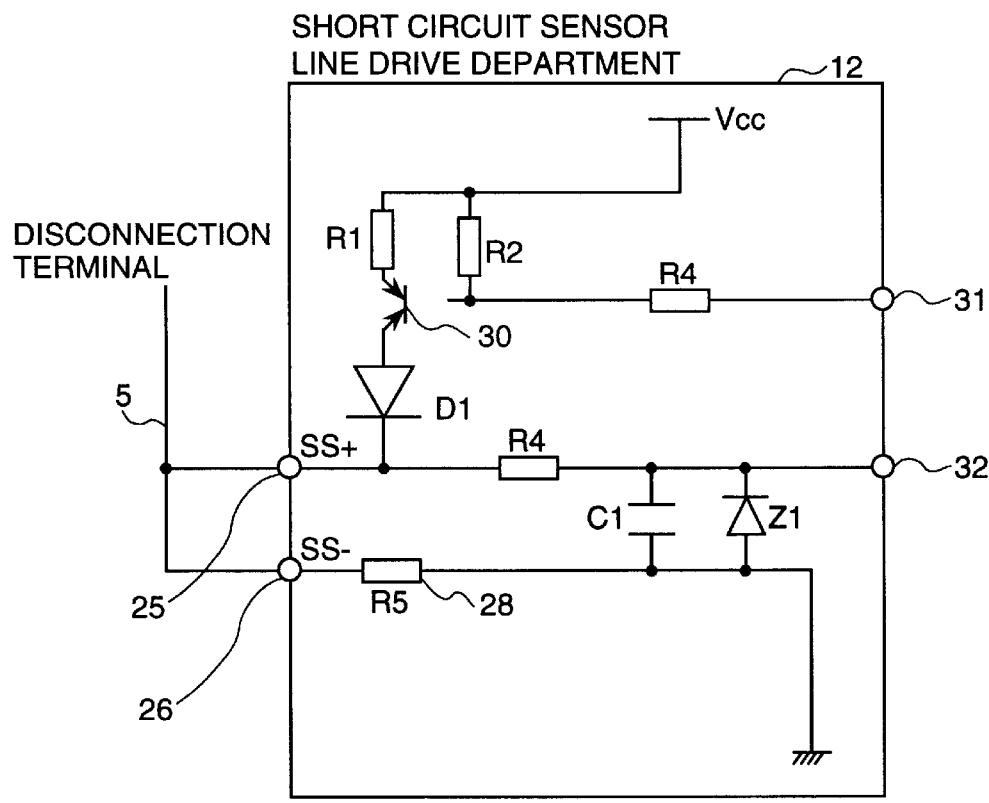
FIG. 6 shows a circuit block-diagram of an electrical conduction line voltage drive department 12 for a short circuit sensor.
FIG. 7 is a truth table for an accident judgment method by the electrical conduction line voltage drive department 12 for the short circuit sensor.

FIG. 6 shows a construction of the short circuit sensor line drive department 12 installed in the module A. The short circuit sensor line drive department 12 is capable of detecting short-circuits of the electrical conduction line 5 to the plus terminal of the battery or to ground. The short circuit sensor line drive department 12 controls the electric potential of the electrical conduction line 5 for the short circuit sensor based on the control signal from the microcomputer 13, and outputs the electric potential of the electrical conduction line 5 for the short circuit sensor to the microcomputer 13. The control signal from the microcomputer 13 is supplied from a short circuit sensor line electric potential control signal terminal 31, and controls the electric potential of the electrical conduction line 5 for the short circuit sensor through the ss+ terminal 25 by controlling the ON/OFF condition of the transistor 30. When the control signal of the microcomputer is High (herein after simply called H), the transistor 30 turns OFF, and the electric potential of the electrical conduction line 5 becomes Low (herein after simply called L).

On the contrary, when the control signal of the microcomputer is L, the electric potential of the electrical conduction line 5 for the short circuit sensor becomes H. When the electrical conduction line 5 for the short circuit sensor short-contacts to the plus terminal of the battery, the electric potential of ss+ becomes the supply voltage (battery voltage), and when the electrical conduction line 5 short-contacts to the ground, it becomes a zero voltage.

The electric potential of the electrical conduction line 5 for the short circuit sensor is output from a short-circuit sensor line electric potential signal terminal 32 to the microcomputer, and the microcomputer detects the cable accident by comparing signal values of the short circuit sensor line electric potential control signal terminal 31 and the short circuit sensor line electric potential signal terminal 32.

The ss+ terminal 25 and the ss− terminal 26 are respectively connected to the electrical conduction line 5 for the short circuit sensor. One side of the electrical conduction line 5 for the short circuit sensor forms a disconnection terminal, an electric current flows through the ss+ terminal 25, the ss− terminal 26, and the resistor R4, and into the ground, thereby, the oxidation of the ss+ terminal and the ss− terminal is prevented. Diode Dl is used to prevent the current from flowing backward into the transistor 30, when the electrical conduction line 5 for the short circuit sensor is short-contacted to the plus terminal of the battery. The resistor R5, the capacitor Cl, the Zener diode Zl form microcomputer protection circuitry.

FIG. 7 shows the relationship between the signal value from the short circuit sensor line electric potential control signal terminal 31 as the terminal of the short circuit sensor line drive department 12 and the signal value from the short circuit sensor line electric potential signal terminal 32. If the signal value from the short circuit sensor line electric potential control signal terminal 31 and the signal value from the short circuit sensor line electric potential signal terminal 32 change together, the cable is judged to be normal, and if they do not change together, the cable is judged to be abnormal.

Figure 8:
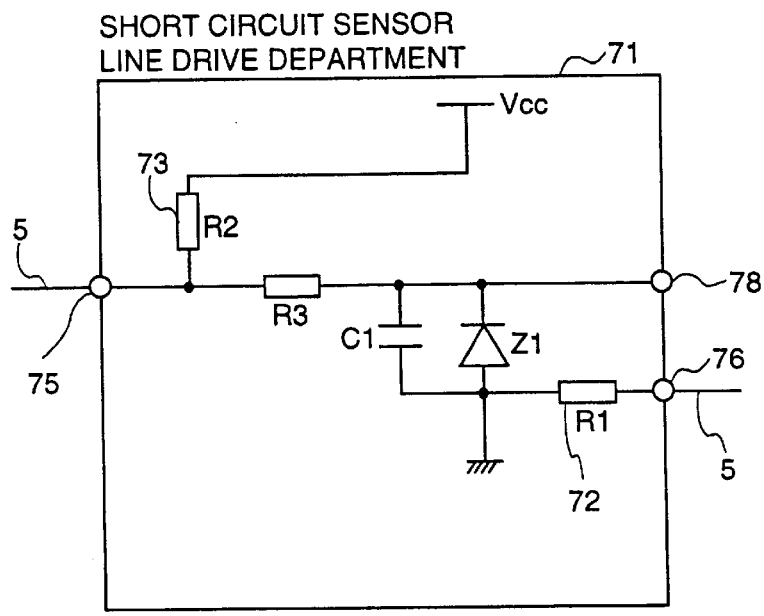
FIG. 8 shows a circuit block-diagram of an electrical conduction line voltage drive department 71 for a short circuit sensor.

FIG. 8 shows a construction of the drive department 71 for the short circuit sensor. The short circuit sensor line drive department 71 is capable of detecting the short-contact to the plus terminal of the battery, the ground fault, and the disconnection of the electrical conduction line 5 for the short circuit sensor. The short circuit sensor line drive department 71 is constructed with resistors R1, R2, and the microcomputer protection circuitry R3, C1, Z1 in order to change the electric potential of the electrical conduction line 5 for the short circuit sensor according to the short-circuit to the plus terminal of the battery, the ground fault, and the disconnection. The terminal 78 for the accident detection is connected to the microcomputer, and the microcomputer detects the accident of the electrical conduction line for the short circuit sensor based on the electric potential of the terminal 78.

Figure 9:
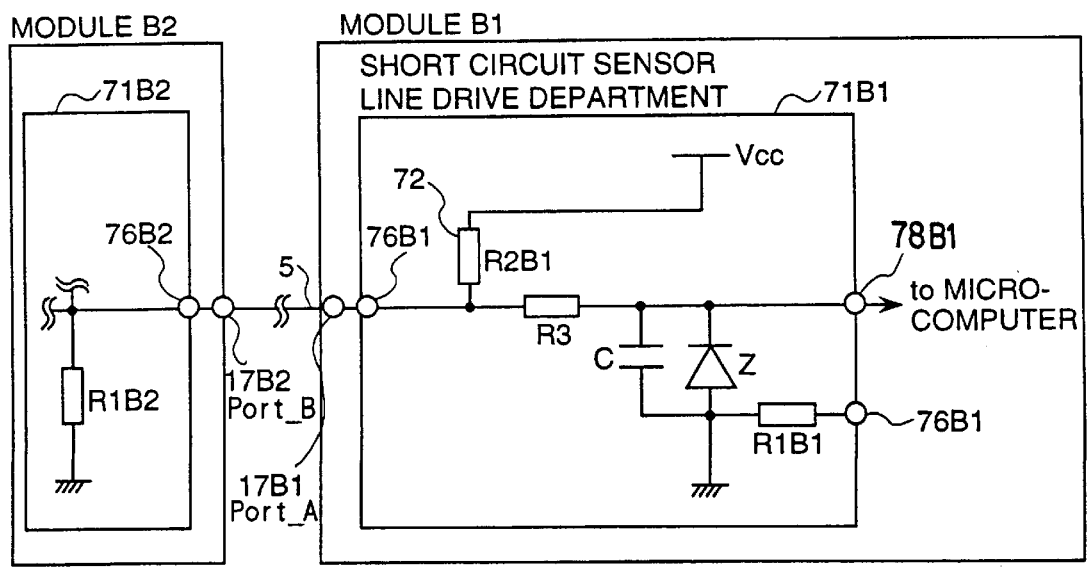
FIG. 9 shows a peripheral circuit block-diagram of an electrical conduction line voltage drive departmental for a short circuit sensor.

FIG. 9 shows the connection of the short circuit sensor line drive department 71. Here, the short circuit sensor line drive department 71B1 and 71B2 of module B will be explained by way of an example. The short circuit sensor line drive department 71B2 will be partly described. The electrical conduction line 5 for the short circuit sensor is connected to the terminal 76B1 through the short circuit sensor terminal 17B1 of the port A of the module B1. On the contrary, relating to the module B2, it is connected to the terminal 76B2 through the short circuit sensor terminal 17B2 of the port_B. The terminal 78B1 is connected to the microcomputer. The microcomputer judges the short-contact to the plus terminal of the battery, the ground fault, the disconnection and the normal operation of the electrical conduction line 5 for the short circuit sensor by watching the electric potential of the terminal 78B1.

Figures 10, 11:
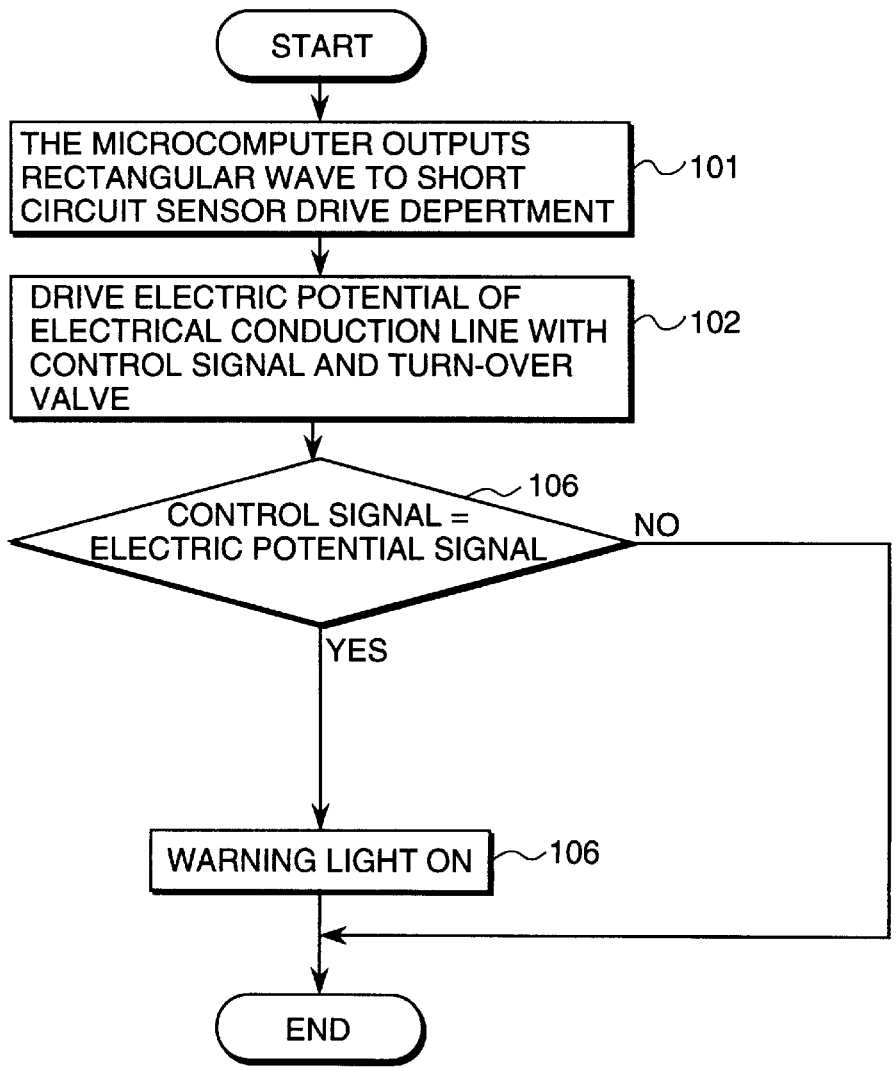
FIG. 10 shows an accident judgment method by the electrical conduction line voltage drive department 71 for a short circuit sensor.
FIG. 11 shows a flow chart for an accident detection and warning light control of the cable 1.

In FIG. 10, the electric potential of the electrical conduction line 5 for the short circuit sensor and the accident situation will be shown, when using the short circuit sensor line drive department 71. This accident judgment is judged by the microcomputer 13 after transmitting the electric potential of the terminal 78 to the microcomputer. The electric potential of the terminal 78 in the short-contact to the plus terminal, normal operation, the disconnection, and the ground fault will be explained as follows. When the short-contact to the plus terminal occurs, the potential of the electrical conduction line 5 for the short circuit sensor becomes equal to the power source electric potential, and the voltage of the terminal 78 is raised to VCC by the microcomputer protection circuitry in the short circuit sensor line drive departments 71. When normal, the electric potential of the terminal 78 is determined by the respective resistors R1, R2 of the two short circuit sensor line drive department 71 connected to the electrical conduction line 5 for the short circuit sensor. When the disconnection occurs, the terminal 78 becomes VCC by the microcomputer protection circuitry. When the ground fault occurs, the terminal 78 becomes grounded.

A method for the accident detection of the cable 1 and a control method for the warning light will be shown by FIG. 11. In a step 101, the microcomputer outputs a rectangular wave turning over every ten ms as a control signal of the electric potential of the electrical conduction line 5 for the short circuit sensor to the electrical conduction line electric potential drive department 12 for the short circuit sensor. In a step 102, the electrical conduction line electric potential drive department 12 for the short circuit sensor drives the electric potential of the electrical conduction line 5 for the short circuit sensor with the electric potential having a value, which changes the signal line. In a step 103, the microcomputer compares the control signal with the electric potential of the electric conduction line 5 for the short circuit sensor, and checks whether both have changed together.

If the values of both change together, it is judged as normal, and if the values of both do not, it is judged as abnormal. When judged as abnormal, the warning light driver 34 is operated by the microcomputer 13, and the warning light 11 is turned on in the step 106.

Figure 12:
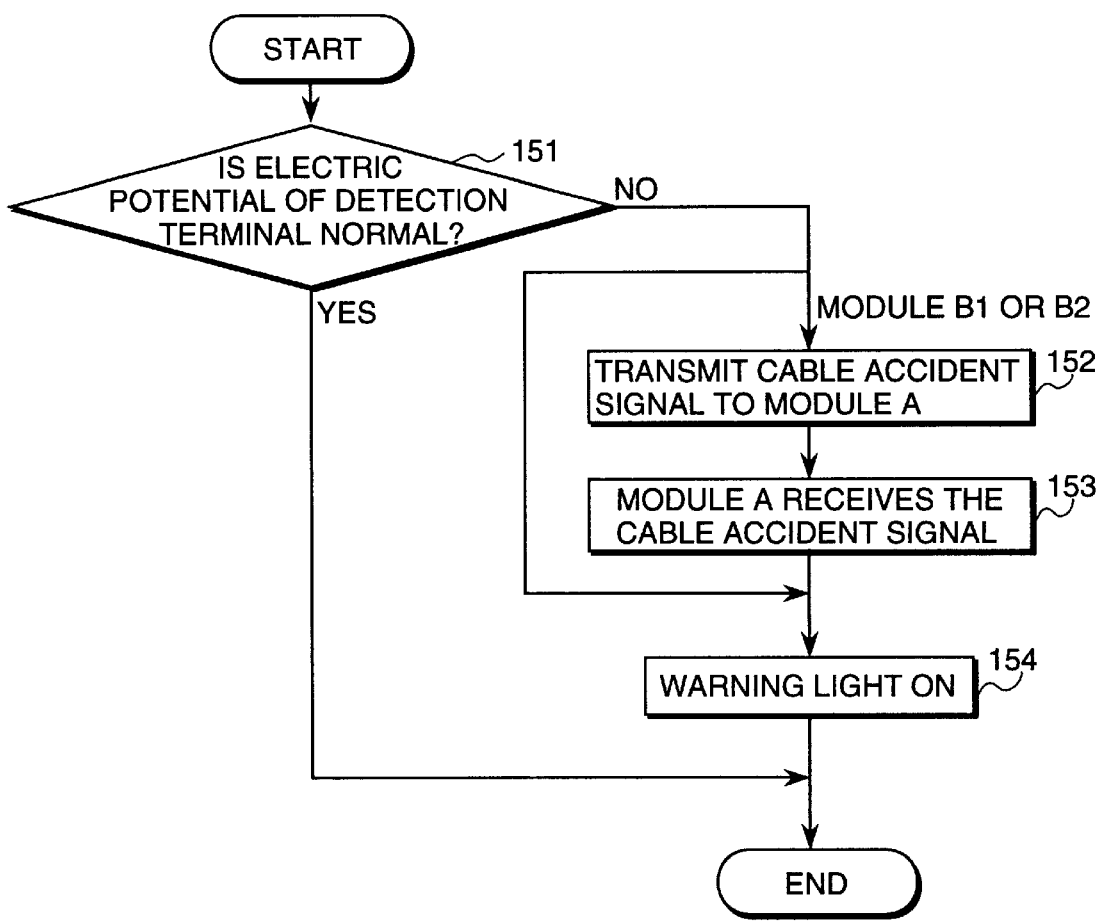
FIG. 12 shows a flow chart for an accident detection and warning light control of the cable 2.

The method for the accident detection of the cable 2 and the control method of the warning light will be shown by FIG. 12. In a step 151, the microcomputer judges if there is an accident in the short circuit sensor line from the electric potential of the detection terminal 78 of the short circuit sensor line drive circuitry 71, and transmits it to the module A in a step 152 when judged as the accident.

The module A receives a message of the accident from the module which has detected the accident in a step 153, and the warning light drive driver 34 is operated by the microcomputer 13 in a step 154, and the warning light 11 is turned on.

Figure 13:
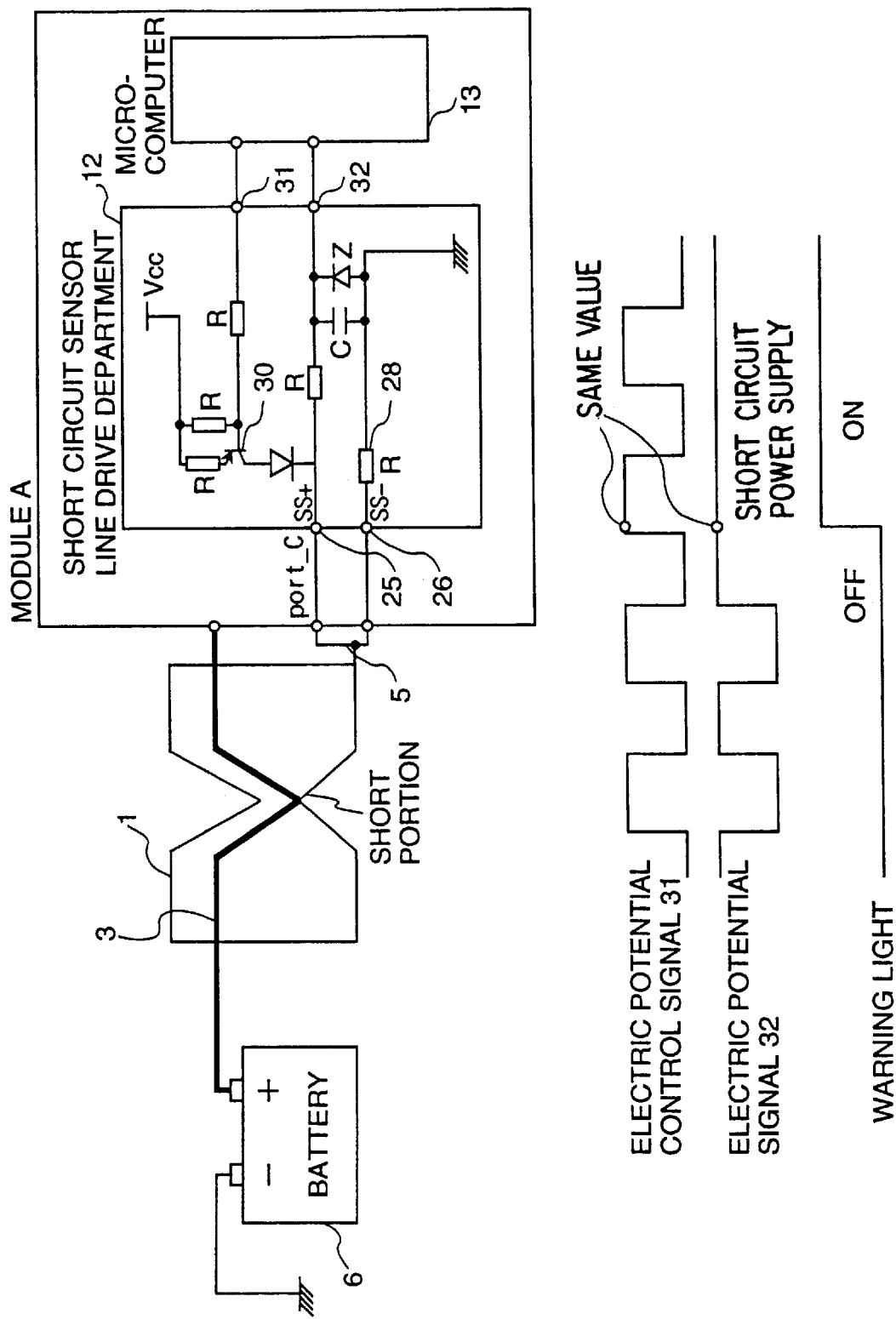
FIG. 13 shows an example of a cable accident as a short circuit of a short circuit sensor line to the electric power source.

An example when the short circuit sensor line 5 for the cable 1 is short-circuited to the power supply line 3 will be shown in FIG. 13. The signal value of the short circuit sensor line electric potential control signal terminal 31 and the signal value of the short circuit sensor line electric potential signal terminal 32 change over from H to L together, the cable is judged as normal, and the warning light 11 remains OFF. When the short circuit sensor line 5 is short-circuited to the power supply line 3, the signal value of the short circuit sensor line electric potential signal terminal 32 becomes an H level regardless of the signal value of the short circuit sensor line electric potential control signal terminal 31. If the signal value from the short circuit sensor line electric potential control signal terminal 31 becomes equal to the signal value from the short circuit sensor line electric potential signal terminal 32, the microcomputer 13 judges the cable to be abnormal and turns the warning light 11 ON.

Figure 14:
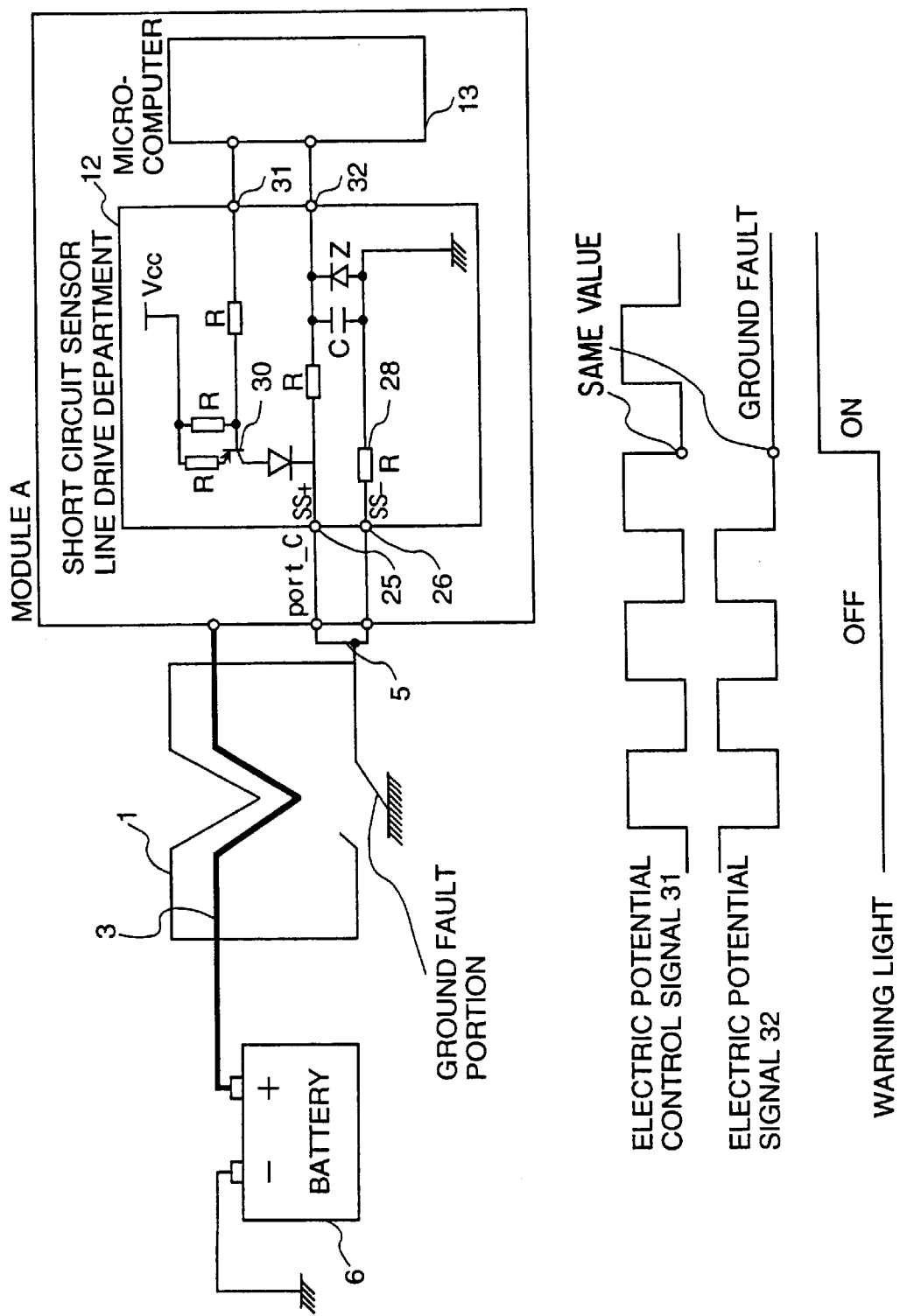
FIG. 14 shows an example of a cable accident as a short circuit of a short circuit sensor line to the ground.

In FIG. 14, an example in which the short circuit sensor line 5 of the cable 1 is short-circuited to the ground will be shown. The signal value of the short circuit sensor line electric potential control signal terminal 31 and the signal value of the short circuit sensor line electric potential signal terminal 32 change over together, thus the cable is judged as normal, and the warning light 11 becomes OFF. When the short circuit sensor line 5 is short-circuited to the ground, the signal value of the short circuit sensor line electric potential signal terminal 32 becomes L level, regardless of the signal value of the short circuit sensor line electric potential control signal terminal 31. If the signal value from the short circuit sensor line electric potential control signal terminal 31 becomes equal to the signal value from the short circuit sensor line electric potential signal terminal 32, the microcomputer 13 judges the cable to be abnormal and turns the warning light 11 ON.

Figure 15:
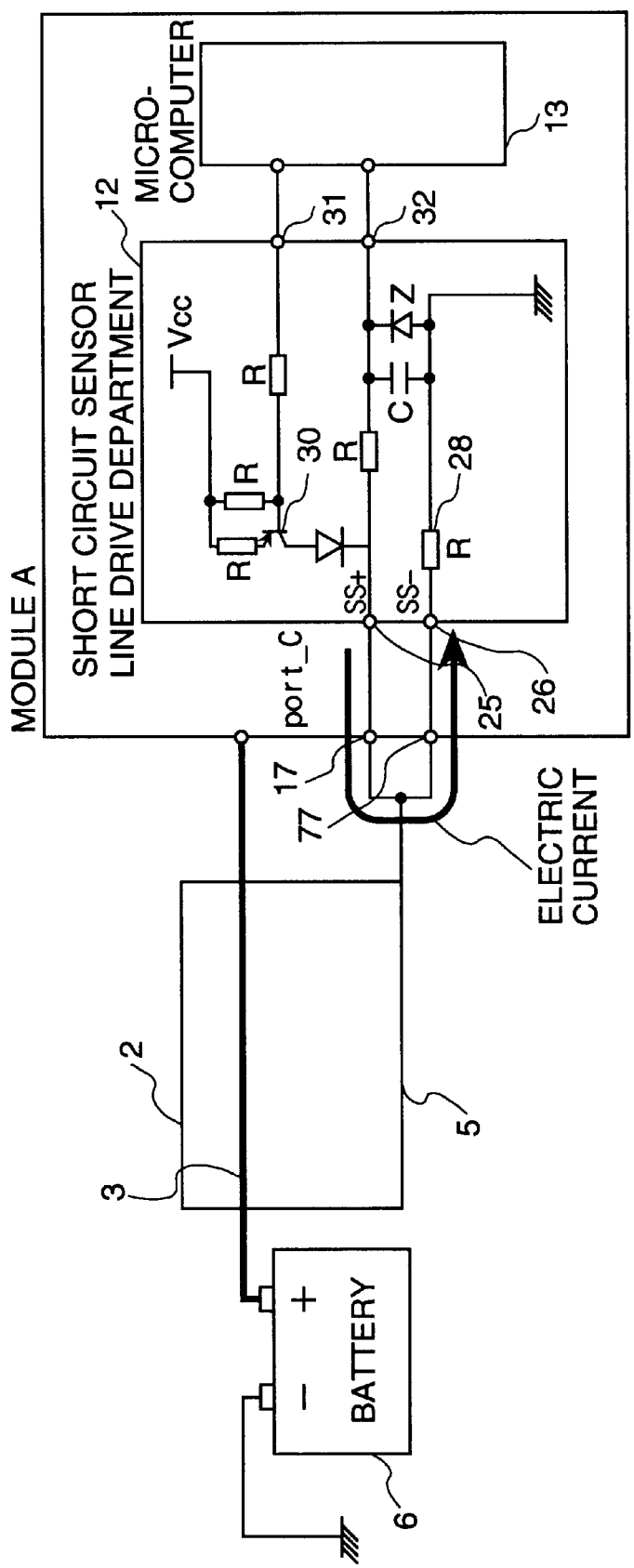
FIG. 15 provides an explanatory view for a functional description of a s++ terminal and a s-- terminal of the short circuit sensor line drive department.

The ss+ terminal and the ss− terminal of the short circuit sensor line drive circuitry 12 will be explained in FIG. 15. As another end terminal of the electrical conduction line 5 for the short circuit sensor is disconnected, the electric current flows from the ss+ terminal 25 into the terminal 17, the terminal 77, and the ss− terminal 26, thereby, the oxidation of the terminal 17 and the terminal 77 may be prevented.

Figure 16:
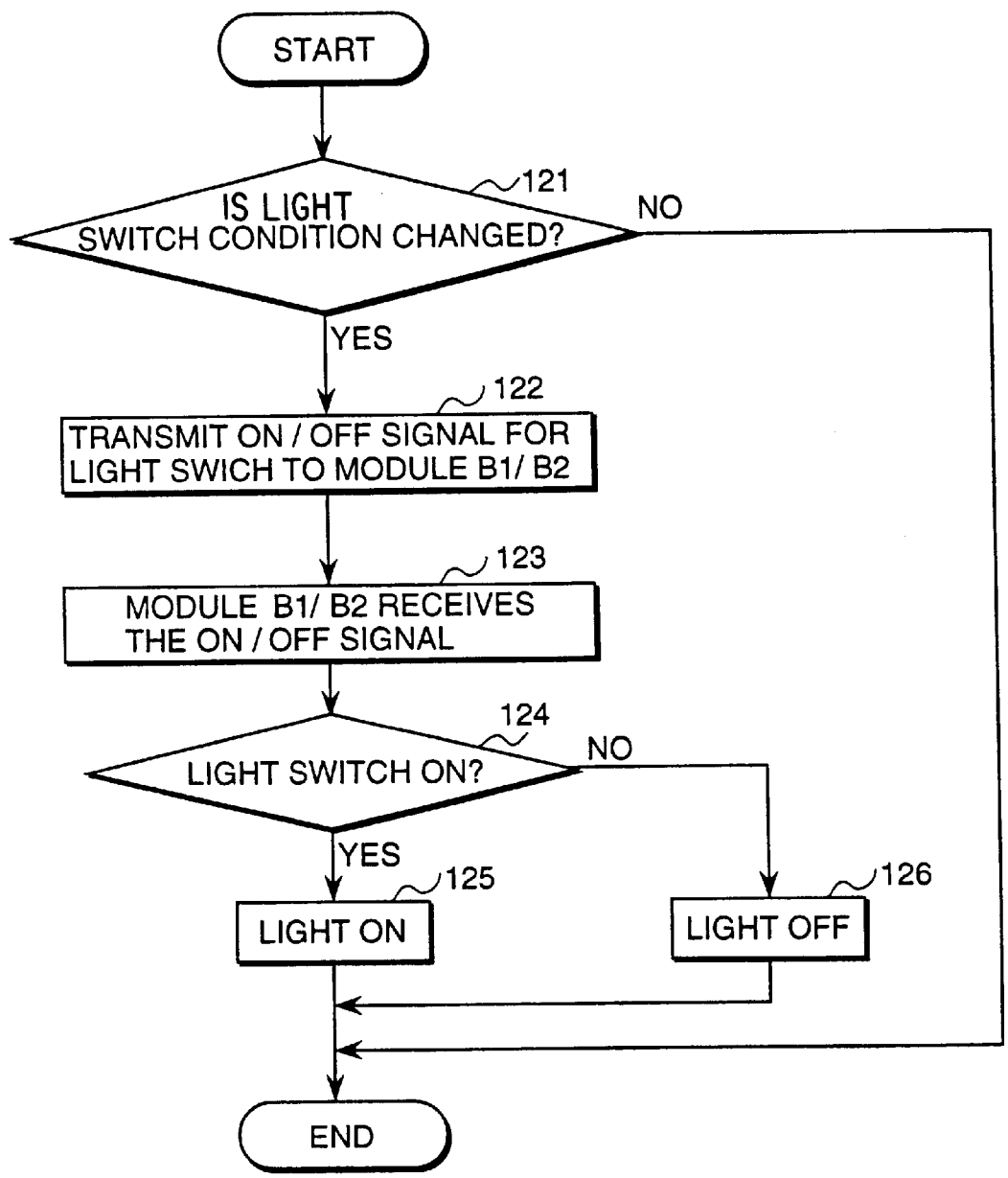
FIG.16 shows a flowchart for controlling the light.

The control method of the light will be shown by FIG. 16. In a step 121, the microcomputer in the module A checks every cycle whether the condition of the light switch has changed or not. When the condition of the light switch 10 is changed, then in a step 122 when it is changed into an ON (OFF) condition, the change thereof is recorded in order to be transmitted to the module B. In a step 123, the module B receives the data, and judges the light to be ON or OFF in a step 124 based on the received data, then in a step 125 (a step 126), the module B operates the light drive switch 18, and turns the light ON (OFF).

In the present invention stated above, the accident of a power supply line may be prevented beforehand by detecting the accident of the cable. Accordingly, as it becomes possible to take a suitable countermeasure before reaching the accident of the power supply line, the reliability of the power supply line is greatly improved.

Moreover, by detecting the accident of the power supply line, the electric fuse may be eliminated so as to reduce the cost of the products.

What is claimed is:

1. An apparatus, having a plurality of controllers, for detecting an abnormality in a plurality of cables, each cable having a power supply line for respectively supplying electric power to one of a plurality of control devices mounted in a car, said apparatus characterized in that one of said plurality of controllers controls a supply of said electric power to another of said plurality of controllers, said another controller serving as a warning device when said abnormality is detected.

2. An apparatus having a plurality of controllers connected with a plurality of cables for detecting an abnormality in said plurality of cables, each cable having a power supply line for respectively supplying electric power to one of a plurality of control devices mounted in a car, said apparatus comprising:

a sensor provided in one of said controllers for detecting a short circuit accident, which occurred in at least one of said plurality of cables, so as to generate a signal, and wherein one of said controllers transmits said signal to other of said controllers through other of said plurality of cables.

3. An apparatus for detecting an abnormality in at least one of a plurality of cables, each cable having a power supply line used in a car, the apparatus comprising: plural control units connected with devices mounted in the car via said cables, at least one of said control units controlling others of said control units so as to respectively transmit signals, said apparatus further comprising:

an abnormality detecting sensor for detecting at least one of a short circuit accident, a short circuit to a power source and a disconnection which occurred in said power supply line which supplies electric power from said power source to said devices, wherein one of said control units receives a signal from said abnormality detecting sensor so as to control other of said control units.

4. An apparatus for detecting an abnormality in at least one of a plurality of cables, each having plurality or power supply lines used in a car, comprising:

a first control unit directly connected with a power source through one of said power supply lines, and a second control unit connected to said first control unit through another of said power supply lines, said apparatus further comprising:

a short circuit sensor for detecting at least one of a short circuit accident, a short circuit to the power source and a disconnection of said one power supply line, another short circuit sensor for detecting at least one of a short circuit accident, a short circuit to the power source and a disconnection of another of said power supply lines, and a warning device activated by at least one of said control units in accordance with an output signal of each of said short circuit sensors.

5. An abnormality detecting apparatus, comprising:

at least three modules, including a first, second and third module, a plurality of cables, each cable having a power supply line and a detection line therearound, wherein said first module is connected with said second module through one of said cables, and said second module is connected with said third module through another of said cables; and a first sensor provided in said first module for detecting a voltage added on said detection line of said one cable and a second sensor provided in said second module for detecting a voltage added on said detection line of said another cable, wherein said voltage added to said detection line is defined to be between a power supply line voltage $V_{cc}$ and a ground voltage.

6. An abnormality detecting apparatus according to claim 5, wherein:

one end of each said detection lines is connected to said power supply line voltage at one of said modules through a resister and another end of each said detection line is connected to said ground voltage at another of said modules through another resister.

* * * * *